(12) United States Patent  
Krasnov et al.

(10) Patent No.: US 7,372,436 B2
(45) Date of Patent: May 13, 2008

(54) OLED DISPLAY WITH CONTRAST ENHANCING INTERFERENCE MEMBERS

(75) Inventors: Alexey N. Krasnov, Mississauga (CA); Richard P. Wood, Delhi (CA); David J. Johnson, Toronto (CA); Peter G. Hofstra, Guelph (CA)

(73) Assignee: Luxell Technologies, Inc., Mississauga, Ontario (CA)

( * ) Notice: Subject to any disclaimer, the term of this patent is extended or adjusted under 35 U.S.C. 154(b) by 189 days.

(21) Appl. No.: 10/518,102

(22) PCT Filed: Jun. 11, 2003

(86) PCT No.: PCT/CA03/00904

§ 371 (c)(1),
(2), (4) Date: Dec. 10, 2004

(87) PCT Pub. No.: WO03/105248

PCT Pub. Date: Dec. 18, 2003

(65) Prior Publication Data
US 2005/0225863 A1    Oct. 13, 2005

Related U.S. Application Data

(60) Provisional application No. 60/387,414, filed on Jun. 11, 2002.

(51) Int. Cl.
*G09G 3/30* (2006.01)
(52) U.S. Cl. ............... 345/76; 345/77; 345/82; 345/169
(58) Field of Classification Search ............ 345/82, 345/36, 37; 313/504, 506
See application file for complete search history.

(56) References Cited

U.S. PATENT DOCUMENTS 6,096,496 A * 8/2000 Frankel ............... 435/4
7,071,613 B2 * 7/2006 Kim et al. ............ 313/504

FOREIGN PATENT DOCUMENTS

| EP | 0 372 763 A | 6/1990 |
| GB | 2 106 317 A | 4/1983 |
| WO | WO 00 35028 A | 6/2000 |
| WO | WO 01 08240 A | 2/2001 |

* cited by examiner

*Primary Examiner*—Richard Hjerpe
*Assistant Examiner*—Leonid Shapiro
(74) *Attorney, Agent, or Firm*—Fay Sharpe LLP (57) ABSTRACT

The present invention introduces a novel design for active matrix displays, utilizing both organic light-emitting diode (OLED) and thin-film electroluminescent technologies. In a first aspect there is provided a top-emitting OLED, including an optical interference contrast-enhancing stack that is placed on the top of the driving thin-film transistor, and which extendes to the entire pixel area to cover the reflecting parts of the pixel. In a second aspect, there is provided a bottom-emitting OIED wherein an optical interference contrast-enhancing stack is placed right under the driving thin-film transistor and, separately between the organic stack and the top electrode, typically a cathode. The optical interference contrast-enhancing stack suppresses light reflection from the thin-film transistor and the upper electrode. In the top emitting design, the optical interference contrast-enhancing stack is placed on the top of the thin-film transistor source and drain electrodes as well as on the top of the opaque bottom electrode. A method of achieving substantial uniformity across a display having multiple areas of optical interference members is also provided.

15 Claims, 9 Drawing Sheets

OLED DISPLAY WITH CONTRAST ENHANCING INTERFERENCE MEMBERS

PRIORITY CLAIM

The present application claims priority from U.S. patent application Ser. No. 60/387,414 filed Jun. 11, 2002, the contents of which are incorporated herein by reference.

FIELD OF THE INVENTION

The present invention relates generally to display technologies and more particularly to relates to reduction of ambient light reflections off of displays.

BACKGROUND OF THE INVENTION

Many display technologies are well known and such technologies are continuing to advance rapidly. For example, modern active matrix display technology can be incorporated into display devices that are relatively lightweight, thin, and which provide high resolution and richly coloured pictures for televisions, computer monitors, and more generally, for a wide variety of display devices that can be incorporated into appliances like personal digital assistants and cellular telephones. While current active matrix displays can be expensive, it is expected that further research will result in advances that will can reduce the costs of such displays and lead to overall greater usage of active matrix display devices.

Active matrix displays are proving to be superior in many ways to older display technologies such as cathode-ray tubes ("CRT"). However, the problem of "glare" off of active matrix displays is also a concern, just as with older CRTs. "Glare" can be defined as ambient light that is reflected off of the device and back towards the viewer, thereby reducing the contrast and overall performance of the display device.

Thus, it is also known to incorporate technology to reduce reflectance into displays and thereby improve their performance. In the case of active matrix displays (or indeed, any other type of pixellated display) it is known to use a black matrix of filtering material. The black matrix is mounted in a complementary fashion to the matrix of pixels in the display, such that the black matrix is a generally continuous filter that surrounds each pixel. Black matrices are described in a number of patents and patent applications, such as "Anti-reflector black matrix for use in display devices and method for preparation of same", EP 716 334 to Steigerwald ("Steigerwald #1"); "Transmissive Display Device Having Two Reflection Metallic Layers of Differing Reflectances", U.S. Pat. No. 6,067,131 to Sato ("Sato"); "Anti-reflector black matrix display devices comprising three layers of zinc oxide, molybdenum and zinc oxide", U.S. Pat. No. 5,570,212 to Steigerwald ("Steigerwald #2"); "Anti-reflector Black Matrix Having Successively A Chromium Oxide Layer, a Molybdenum Layer And a Second Chromium Oxide Layer", U.S. Pat. No. 5,566,011 to Steigerwald ("Steigerwald #3"); and, "Low Reflectance Shadow Mask", U.S. Pat. No. 5,808,714 to Rowlands et al. ("Rowlands"). One particular disadvantage to Steigerwald #1, Steigerwald #2 Steigerwald #3 and Rowlands is that they are confined to black matrix structures having specific sets of materials. A more general discussion of applying a black matrix as applied to a display having colour filters is found in U.S. Pat. No. 5,587,818 to Lee ("Lee").

However, such prior art black matrix structures are not always useful or practical to incorporate into display devices. For example, prior art black matrix structures are frequently formed as a separate unit from the display, thereby eventually requiring the assembly of the black matrix structure to the display structure, such as by mounting the black matrix structure to the front of the display.

It is also known to use optical interference to reduce reflectance in various thin film display technologies, such as electroluminescent devices ("ELD"s). For example, reducing reflectance of ambient light can be achieved by using additional thin film layers sandwiched between one or more layers of the ELD, which are configured to achieve destructive optical interference of the ambient light incident on the display, thereby substantially reducing reflected ambient light. Optical interference technology is discussed in detail in U.S. Pat. No. 5,049,780 to Dobrowolski et al., ("Dobrowolski") and U.S. Pat. No. 6,411,019 to Hofstra et al. ("Hofstra"). In addition, certain inventors of the present invention have also contemplated the use of the optical interference technology taught in Hofstra and Dobrowolski in conjunction with the bus lines that form the matrix surrounding each pixel in an active matrix display. See Canadian Patent Application 2,364,201 filed Dec. 12, 2001.

More recently, U.S. Pat. No. 6,429,451 to Hung ("Hung") has proposed another type of ambient light reducing layer also for incorporation into a pixel of the ELD.

However, notwithstanding the improvements provided by the prior art, it is now been discovered that the prior art does not provide ambient light reduction across all areas of the display, as is now offered by polarizers that are also used with prior art displays. Because polarizers can offer substantially uniform ambient light reduction across the entire viewable surface of the display, polarizers can be preferred over other prior art solutions that embed or otherwise incorporate the ambient light reduction means within the actual display structure. In order to obviate the need for polarizers and achieve the attendant advantages eliminating the post production costs associated with polarizers, it is desired to provide a means to substantially uniformly reduce ambient light reflection across the entire viewable surface of the display by means of embedding the contrast enhancement apparatus within the display.

SUMMARY OF THE INVENTION

It is therefore an object of the present invention to provide a display that obviates or mitigates at least one of the disadvantages of the prior art.

An aspect of the invention provides a display device comprising a plurality of emitting pixels and at least one switching electronic corresponding to each pixel for selectively activating or deactivating the pixel. The device also comprises at least one additional component for interconnecting the pixels and the switching electronics, and at least two ambient light reducing members each integrally embedded into at least one of: a) the pixels, b) the switching electronics and c) the at least one additional component. The ambient light reducing members are disposed in a plane that is visible to a viewer and are selected from materials and thicknesses such that the reduced ambient light reflections in the plane are substantially uniform.

The emitting pixels can be bottom emitting or top emitting. The at least one additional component can be a set of bus lines for delivering electrical current to the pixels and the switching electronics.

The emitting pixels can be comprised of an OLED stack and wherein at least one of the ambient light reducing members is integrated with the OLED stack.

The at least one of the ambient light reducing members can be integrated with the switching electronics. The at least one ambient light reducing members can thus form part of the electronic circuitry of the switching electronics. The switching electronics can include at least one transistor and the ambient light reducing member can be a storage capacitor for the at least one transistor.

The ambient light reducing member can be an optical interference member. Where an optical interference member is used it can include a semi-absorbing layer for reflecting a portion of incident ambient light, a substantially transparent layer for phase shifting another portion of ambient light and a reflective layer for reflecting the phase shifted ambient light such that the two reflected portions of light are out-of-phase and thereby destructively interfere.

Another aspect of the invention provides a display device comprising a plurality of emitting pixels. The device also comprises at least one switching electronic corresponding to each pixel for selectively activating or deactivating the pixel. The device also comprises at least one additional component for interconnecting the pixels and the switching electronics. An ambient light reducing member is integrally embedded into the switching electronic to form part of an electronic circuitry of the switching electronics. The ambient light reducing member is disposed in a plane that is visible to a viewer and selected from materials and thicknesses to reduce ambient light reflections. The electronic switching components include at least one transistor and the ambient light reducing member is a storage capacitor for the at least one transistor.

Another aspect of the invention provides a computer implemented method of matching the reflectance between different ambient light reducing members in a display comprising the steps of:
  receiving a first set of data representing an initial specification for a first set of components in an active display device;
  determining, based on the first set of data and a predefined database of ambient light reducing member configurations, a first ambient light reducing member for incorporation into the first set of components;
  receiving at least one additional set of data representing an initial specification for at least one additional set of components in the active display device;
  determining, based on the at least one additional set of data and the predefined database, at least one additional ambient light reducing member for incorporation into the at least one set of components;
  generating a model of the active display device based on an assembly of the first set of data, the first ambient light reducing member, the at least one additional set of data, and the at least one additional ambient light reducing member;
  measuring ambient light reflectance across the model;
  determining whether the measured reflectance is substantially uniform and, if the reflectance is non-uniform, reconfiguring at least one of the specifications and the ambient light members until a desired level of uniformity is achieved; and,
  outputting a final specification for the display.

The first set of components in the method can be light emitting pixels and the at least one additional set of components can be switching electronics corresponding to the light emitting pixels.

BRIEF DESCRIPTION OF THE DRAWINGS

The present invention will now be described, by way of example only, with reference to certain embodiments shown in the attached Figures in which.

DETAILED DESCRIPTION OF THE INVENTION

Figure 1:
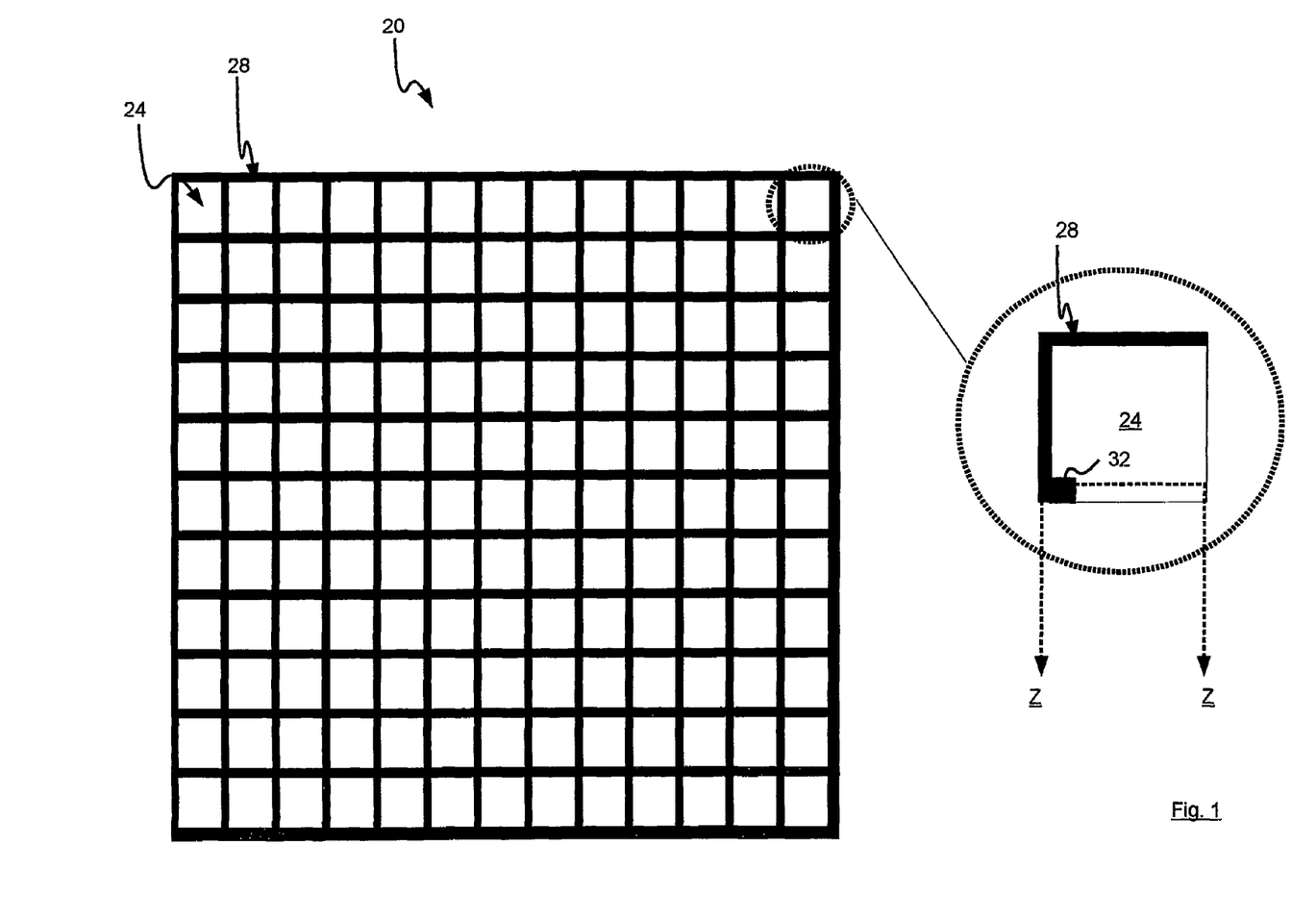
FIG. 1 is a schematic representation of at least a portion of a matrix display.
Figure 2:
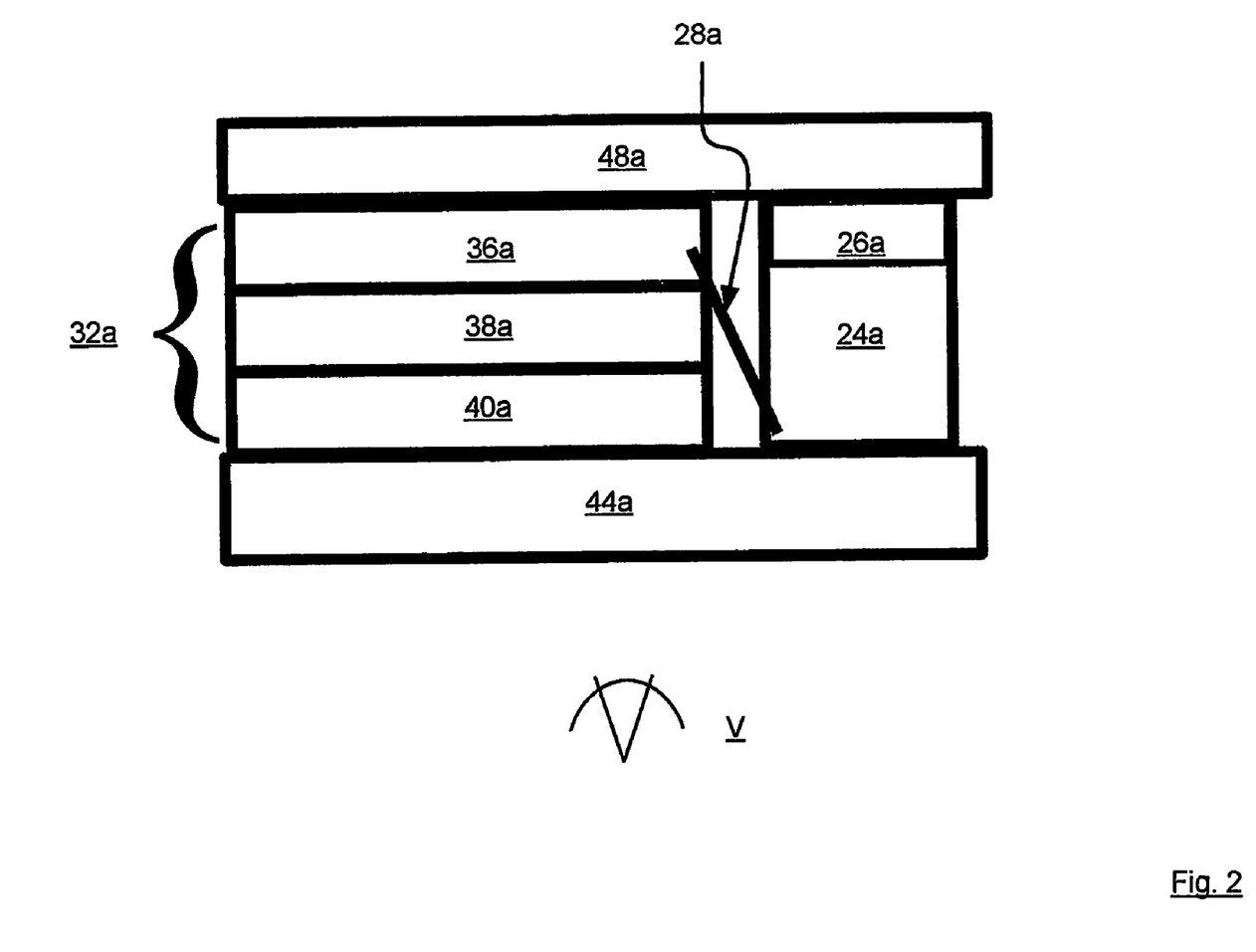
FIG. 2 is a schematic representation of a cross-section of a single bottom-emitting pixel such as may be found in the display of FIG. 1 and that is in accordance with an embodiment of the invention.

Referring now to FIG. 1 at least a portion of an exemplary matrix display is indicated generally at 20. Display 20 comprises a plurality of pixels 24 (only one of which is labelled). Each pixel 24 is surrounded by a grid of bus lines 28 and is adjacent to a set of electronic components 32 respective to that pixel. FIG. 2 shows a particular implementation of display 20 in FIG. 1, by showing a particular pixel through lines Z-Z in FIG. 1. In particular, FIG. 2 shows a bottom emitting display configuration with a pixel 24a and its adjacent electronic components 32a. A viewer V in FIG. 2 shows the side from which pixel 24a is viewed, and thus from which ambient light is incident on pixel 24a. Pixel 24a is preferably based on organic light emitting display ("OLED") technology that includes one or more optical interference layers 26a for ambient light reduction, such as that taught in Hofstra. Electronic components 32a include a switching electronics layer 36a that is comprised of a transistor or other switching means for selectively actuating pixel 24a via an interconnect 28a. Electronic components 32a also includes an insulator 38a disposed below switching electronics layer 36a, and an optical interference member 40a disposed below insulator 38a. Optical interference member 40a and pixel 24a are themselves disposed above a glass substrate 44a. Insulator 38a is any material and thickness that will electrically isolate optical interference member 40a from switching electronics layer 36a. An additional optical interference member 48a is disposed behind both pixel 24a and switching electronics layer 36a. (Optical interference member 48a can be associated with any other aspects of the display, such as, for example the bus lines that interconnect the switching electronics layer 36a.)

It should be noted that terms such as "above" and "below" are used herein for convenience and are to be read in conjunction with the drawings, and as such are not to be construed in a limiting manner.

As previously mentioned, optical interference members 26a, 40a and 48a can be based on known formulations of optical interference members, as taught in, for example Hofstra and/or according to other desired means of formulating an optical interference member. However, due to the virtually infinite number of formulations of optical interference members the potential can arise for variations between those different formulations such that while all formulations may appear "dark" and have acceptable performance on their own, when different formulations are placed side by side, contrasts between those formulations may be detectable in an undesired way, such that the overall "darkness" of the display is non-uniform.

Figure 3:
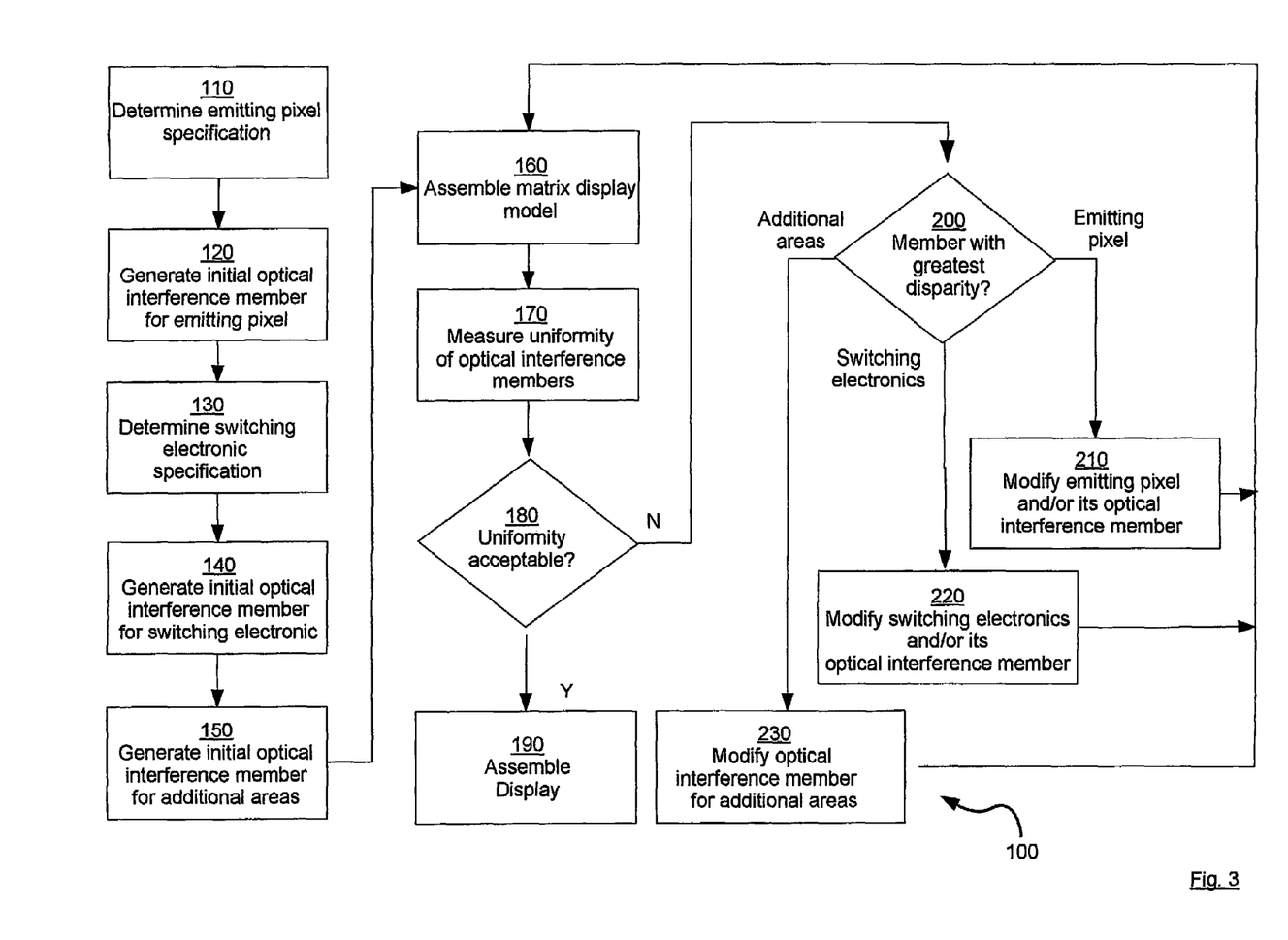
FIG. 3 is a flow chart depicting a method of providing contrast enhancement to the pixel of FIG. 2 and the display associated therewith.

Accordingly, referring now to FIG. 3, in an another embodiment of the invention a method of matching the reflectance between different optical interference members in a matrix display is indicated generally at 100. Method 100 is specifically configured to be used to develop a display in accordance with the pixel 24a and switching electronics 36a of FIG. 2, but it is contemplated that method 100 can be modified for use with other types of matrix display configurations. Before beginning method 100, it is thus assumed that the matrix display being designed is in accordance with the configuration of FIG. 2, and that design specifications relating to the display technology for pixel 24a, the pitch of each pixel 24a, the fill factor, and the like have been previously established. Thus, beginning at step 110, the specifications for each emitting pixel are each determined. Factors to be determined include the emitting technology, the power requirements for switching the pixel, the colour of the pixel, the materials and thicknesses for the pixel. Next, at step 120, an initial optical interference member corresponding to the specifications determined at step 110 is generated using known techniques, such as the techniques taught in Hofstra. In particular, various materials and thicknesses are selected for optical interference member 26a in order to provide at least some reduction of incident ambient light on pixel 24a. Further, optical interference member 26a is designed to cooperate with the desired electrical characteristics to operate pixel 24a. In general, it is expected that the initial optical interference member will be coarsely calculated to match the other desired specifications of the emitting pixel, while providing a reduction of incident ambient light on pixel 24a. At step 130, the specifications for switching electronics 36a are determined. It is generally expected that the specifications for switching electronics 36a will thus be chosen to correspond with the electrical properties needed to activate and deactivate pixel 24a, while also matching with the other previously chosen specifications for the display. Next, at step 140, an initial optical interference member 40a corresponding to the specifications determined at step 130 is generated using known techniques. In particular, various materials and thicknesses are selected for optical interference member 40a in order to coat switching electronics 36a such that reflections off of switching electronics 36a are reduced. In this embodiment, optical interference member 40a is electrically conducting and it is therefore desired to also include insulator 38a to isolate electronics 36a from member 40a. In general, optical interference member 40a is chosen to cooperate with the desired electrical characteristics of switching electronics 36a, while providing a reduction of incident ambient light on switching electronics 36a. Similarly, at step 150, an initial optical interference member 48a is generated using appropriately selected materials and thicknesses in order to provide an additional insulating optical interference member that coats all or part of the area behind electronics 36a and pixel 24a and which provides ambient light reduction for incident ambient light that is not otherwise reduced by optical interference members 26a and 40a.

Next, at step 160, a complete model for a display is assembled using the results of steps 110-150. Such a model can be assembled by physically building a sample display and/or through computer modeling. At step 170, the uniformity of ambient light reflection reduction from optical interference members 26a, 40a and 48a is measured. Where a physical model has been built, then such measurements are effected using measurement equipment using various ambient light conditions, and in the case of a computer model then simulated measurements are taken based on simulated ambient light conditions. Sample ambient light conditions can include direct sunlight, room lighting, and so forth, depending on the expected operating environment for the display.

At step 180, a determination is made as to whether the measured uniformity is acceptable. If yes, the method advances to step 190 and full production of the display can be commenced. However, typically the uniformity will not be acceptable on the initial design and the method advances to step 200, where the greatest level of disparity in uniformity is determined. The method advances to steps 210, 220 or 230 depending on whether the greatest disparity is caused by the optical interference member 26a, 40a or 48a, respectively. At those steps 210, 220 or 230, modifications to the corresponding optical interference member 26a, 40a or 48a are effected (and/or effected to the associated component), at which point the method returns to step 160 where a new matrix display model is generated. The method then moves again through steps 170 and 180 and through the remaining steps as needed until an acceptable uniformity level is achieved.

Method 100 is preferably implemented in computer software that includes known material sets and thicknesses ranges for developing optical interference members, and associated design specification for associated pixels and switching electronics. In this manner, a substantially uniformly dark matrix display can be modeled and developed in a time efficient manner.

It is presently preferred that the difference between the reflectivities of each optical interference member (or other ambient light reducing member) be less than about ten percent. More preferably, the difference between the reflectivities is less than about three percent. More preferably, the difference between the reflectivities is less than about one percent. It is presently preferred that the difference between the reflectivities is less than about 0.5 percent.

An optical interference member (such as optical interference members 26a, 40a or 48a) can be based on a three layer structure of: i) a semi-absorbing layer that is partially reflective, partially absorbing and partially transmissive of ambient light, ii) a substantially transparent layer that phase shifts the incoming ambient light, and iii) followed by a reflective rear layer (which may be electrically part of the pixel or other component with which the optical interference member is associated, or not, as desired). Where the optical interference member is based on this structure, then the software will be optimized to choose materials and thicknesses based on the appropriate functionalities of those layers. Thus, the software package will look for materials and thicknesses of the semi-absorbing layer such that a portion of ambient light incident on the member is partially reflected off of the member, while a remaining portion passes into the partially transmissive layer therebehind. The software will then choose thicknesses and materials for the partially transmissive layer such that a phase shift of about one-hundred-and eighty-degrees occurs in the ambient light passing through partially transmissive layer. The final reflective rear layer is chosen to provide sufficient reflection, and/or have appropriate electrical properties. The overall optical interference member may be work function matched for an OLED pixel, and/or may be otherwise electrically matched with its surrounding materials. The software will thus include a database of possible materials for a semi-absorbing layer that includes Cr, Al, Mg:Ag, inconel or Ni, Cu, Au, Mo, Ni, Pt, Rh, Ag, W, Co, Fe, Ge, Hf, Nb, Pd, Re, V, Si, Se, Ta, Y, Zr. The software will thus include a database of possible materials for a partially reflecting material that includes Aluminum Silicon Monoxide, Chromium Silicon Monoxide, $Al_2O_3$, $SiO_2$, $ZrO_2$, $HfO_2$, $Sc_2O_3$, $TiO_2$, $La_2O_3$, MgO, $Ta_2O_5$, $ThO_2$, $Y_2O_3$, $CeO_2$, $AlF_3$, $CeF_3$, $Na_3AlF_6$, $LaF_3$, $MgF_2$, $ThF_4$, ZnS, $Sb_2O_3$, $Bi_2O_3$, $PbF_2$, NdF3, $Nd_2$ $_{LiF}$, $_{GdO_3}$.

The software can also include databases of other types of optical interference members based on other types of structures (i.e. the type of structure in PCT/CA02/00844, or PCT/CA03/00498, incorporated herein by reference), so that a plurality of different types of optical interference members can be selected in order to achieve the desired uniformity.

Figure 4:
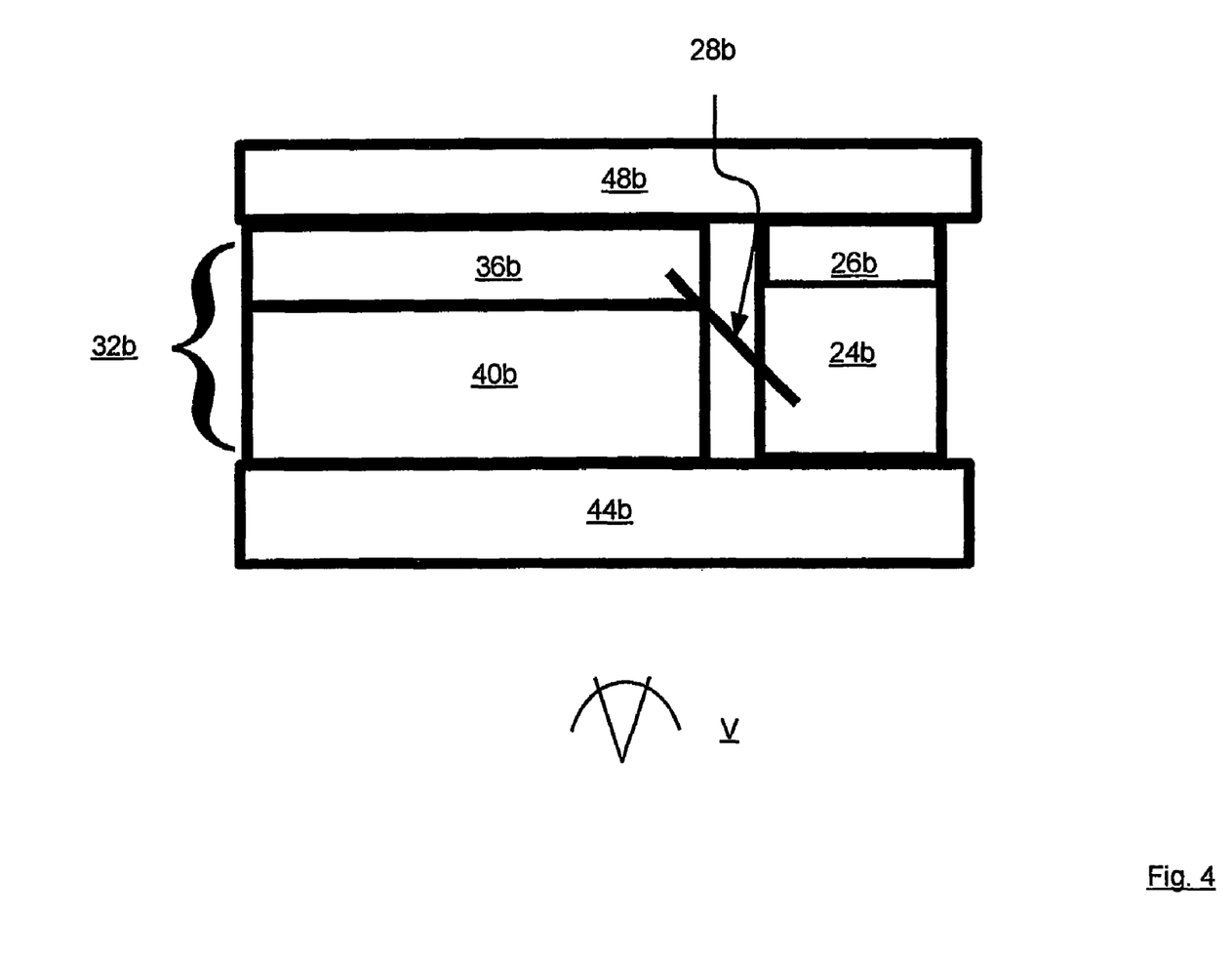
FIG. 4 is a schematic representation of a cross-section of a single bottom-emitting pixel in accordance with another embodiment of the invention.

The embodiments in FIG. 3 can be modified and/or varied and/or otherwise applied to various display configurations. For example, FIG. 4 shows a bottom emitting display configuration with a pixel 24b and its adjacent electronic components 32b. A viewer V in FIG. 4 shows the side from which pixel 24b is viewed, and thus from which ambient light is incident on pixel 24b. The display configuration in FIG. 4 is thus substantially the same as the display configuration in FIG. 2, except that insulator 38a is omitted. In this case the materials selected for optical interference member 40b are preferably non-conducting so as to not interfere with switching electronics 36a.

Figure 5:
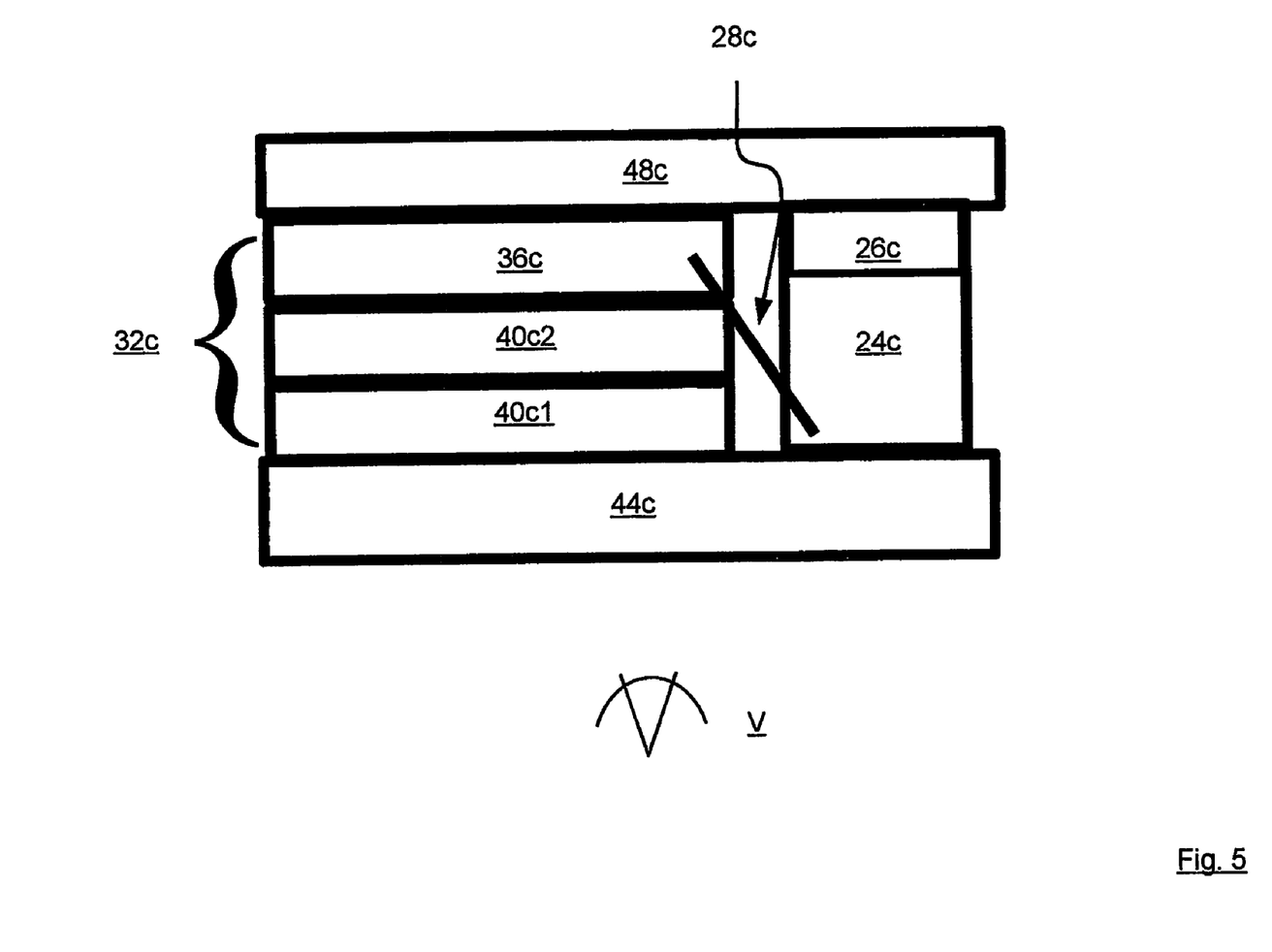
FIG. 5 is a schematic representation of a cross-section of a single bottom-emitting pixel in accordance with another embodiment of the invention.

As another example, FIG. 5 shows another bottom emitting display configuration with a pixel 24c and its adjacent electronic components 32c. A viewer V in FIG. 5 shows the side from which pixel 24c is viewed, and thus from which ambient light is incident on pixel 24c. The display configuration in FIG. 5 is thus substantially the same as the display configuration in FIG. 4, except that two optical interference members 40c1 and 40c2 are provided proximal to switching electronics 36c. Optical interference members 40c1 and 40c2 can be the same structure or different, and thus the method in FIG. 3 would be modified to accommodate determining whether substantial uniformity is achieved for all optical interference members 26c, 40c1, 40c2 and 48c. Optical interference member 40c1 performs substantially the same function as optical interference member 40b, reducing ambient light that is incident on glass substrate 44c. Optical interference member 40c2, however, is reversed, so that it reduces reflections of light that emanate off of the back of the display (i.e. the side opposite from glass substrate 44c). Typically, optical interference member 40c2 is designed to reduce pixel blooming, to reduce backward reflections of emitted light from pixels adjacent to pixel 24c. It should now be apparent that the configurations in the examples of FIGS. 2, 4, and 5 can be combined as well to produce additional examples.

Figure 6:
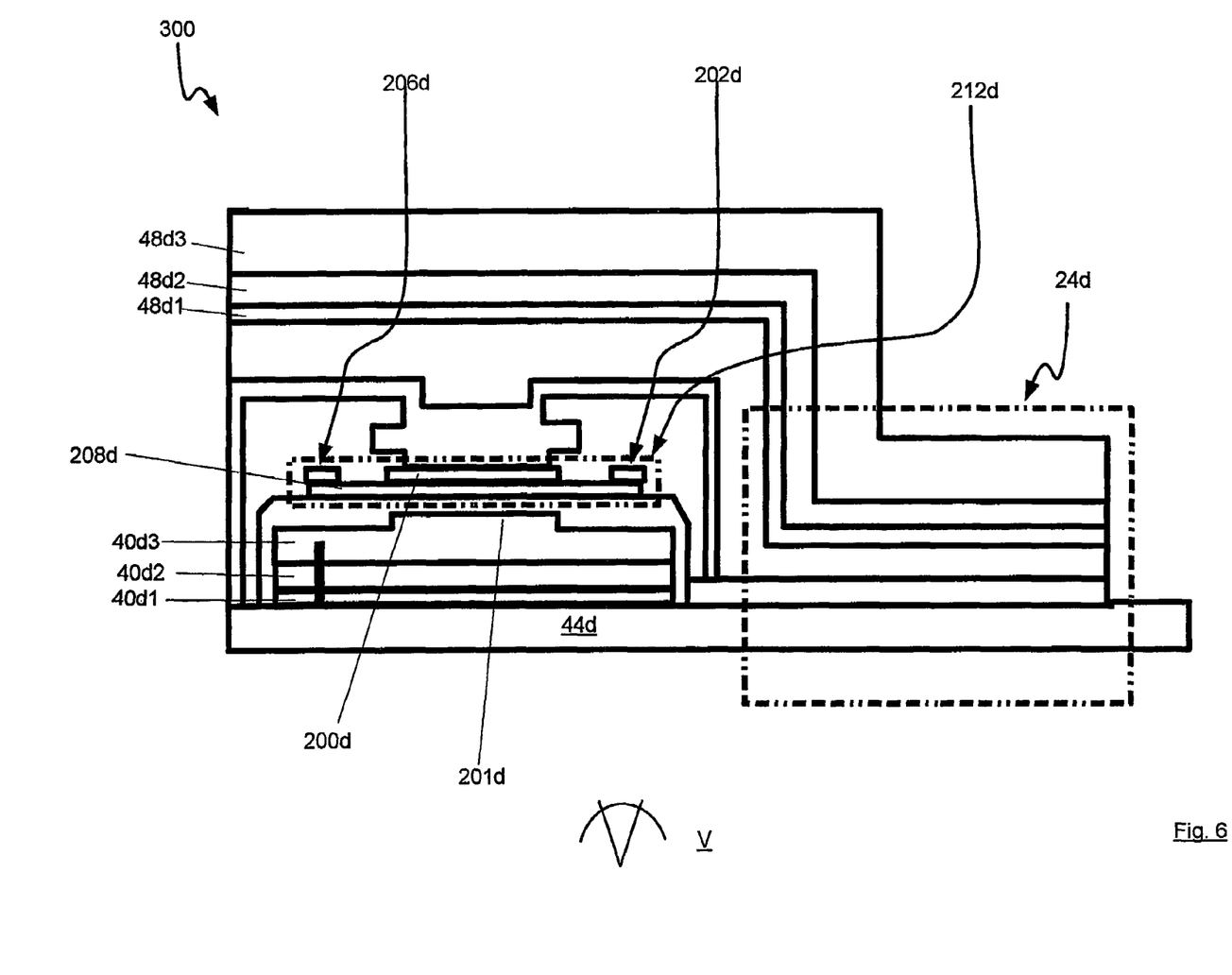
FIG. 6 is a schematic representation of a cross-section of a single bottom-emitting pixel in accordance with another embodiment of the invention.

In general, it should be understood that the structures in FIGS. 2, 4 and 5 are simplified for purposes of explanation. A somewhat more complex example, shown in FIG. 6, is another bottom emitting display configuration with an optical interference member 40d that is integral with its surrounding switching electronics, such that optical interference member 40d forms a dual function as a storage capacitor as a gate 201d as part of the switching electronics for activating an OLED based pixel 24d. A circuit diagram representing the components in FIG. 6 is shown in FIG. 7 and is indicated at 300.

Of particular note, optical interference member 40d acts as a storage capacitor to hold the charge that is used to activate the transistor that ultimately provides current to pixel 24d in order to cause pixel 24d to emit light. Concurrently, optical interference member 40d acts to mask the switching electronics used to activate pixel 24d.

Switching electronics also includes a drive TFT 212d, that itself includes a semi-conductor 204d, which can be made from CdSe, or a-Si or poly-Si. Drive TFT 212d also includes a source 202d, a drain 206d, a channel 208d, and a substrate 200d.

Figure 7:
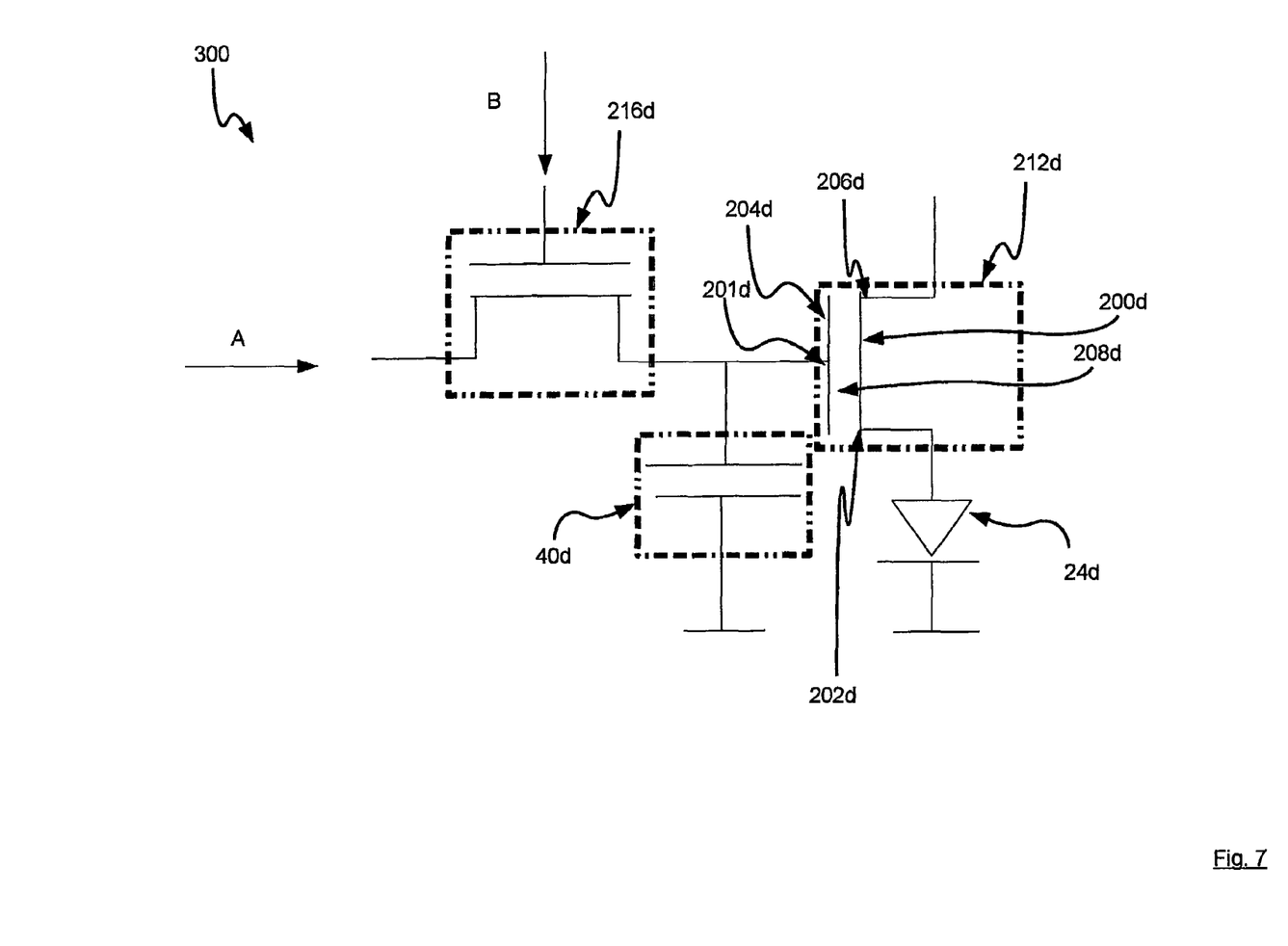
FIG. 7 is a schematic diagram representative of the electrical circuit of the pixel in FIG. 6.

FIG. 7 also shows a data transistor 216d, (not shown in FIG. 6), that connects as shown in FIG. 7 to optical interference member 40d. Data is introduced to data transistor 216d along arrow A, and a select signal is provided to data transistor 216d along arrow B.

It is to be noted that optical interference members 40d and 48d are of the above-described three-layer format, but other optical interference member configurations are contemplated. The composition of the optical interference member may depend on the particular application. The initial, semi-absorbing layer 48d1 can be Cr, Al, Ag, Mg, Cs, Pt, Au, Li, and their alloys. They can be deposited using thermal evaporation, e-beam, or sputtering techniques. The subsequent substantially transparent phase shifting layer 48d2 (which is also conducting in this embodiment) can be made of AlSiO, CrSiO, chrome oxide, zinc oxide, indium tin oxide, indium oxide, and other transparent conducting oxides.

(In other embodiments, an insulating phase shifting layer can be made of SiO, SiO2, Si3N4, SiON, ZnO, and other dielectric materials.)

The semiconductor component of thin-film transistors may utilize amorphous silicon, poly-silicon, continuous-grain silicon, cadmium selenide, and/or other suitable semi-conducting materials. An exemplary technological method to fabricate the display in FIG. 6 is as follows: The bottom transparent electrode is fabricated first on a glass (or flexible plastic) substrate 44d using standard patterning methods. Next, the optical-interference member 40d stack is fabricated proximal to the thin film transistor 212d part of the pixel 24d using thermal evaporation, electron-beam evaporation, or sputter deposition techniques and masking and patterning techniques known in the art. Next, the active-matrix drive circuitry is deposited then, using standard-fabrication methods. Next, a small-molecule or polymer organic light-emitting stack (ie pixel 24d) is then deposited following well-known deposition techniques. Then, the optical interference member 48d is then deposited again to increase contrast of the emitting part of the pixel 24d. The device is then encapsulated using techniques known in the art.

Figure 8:
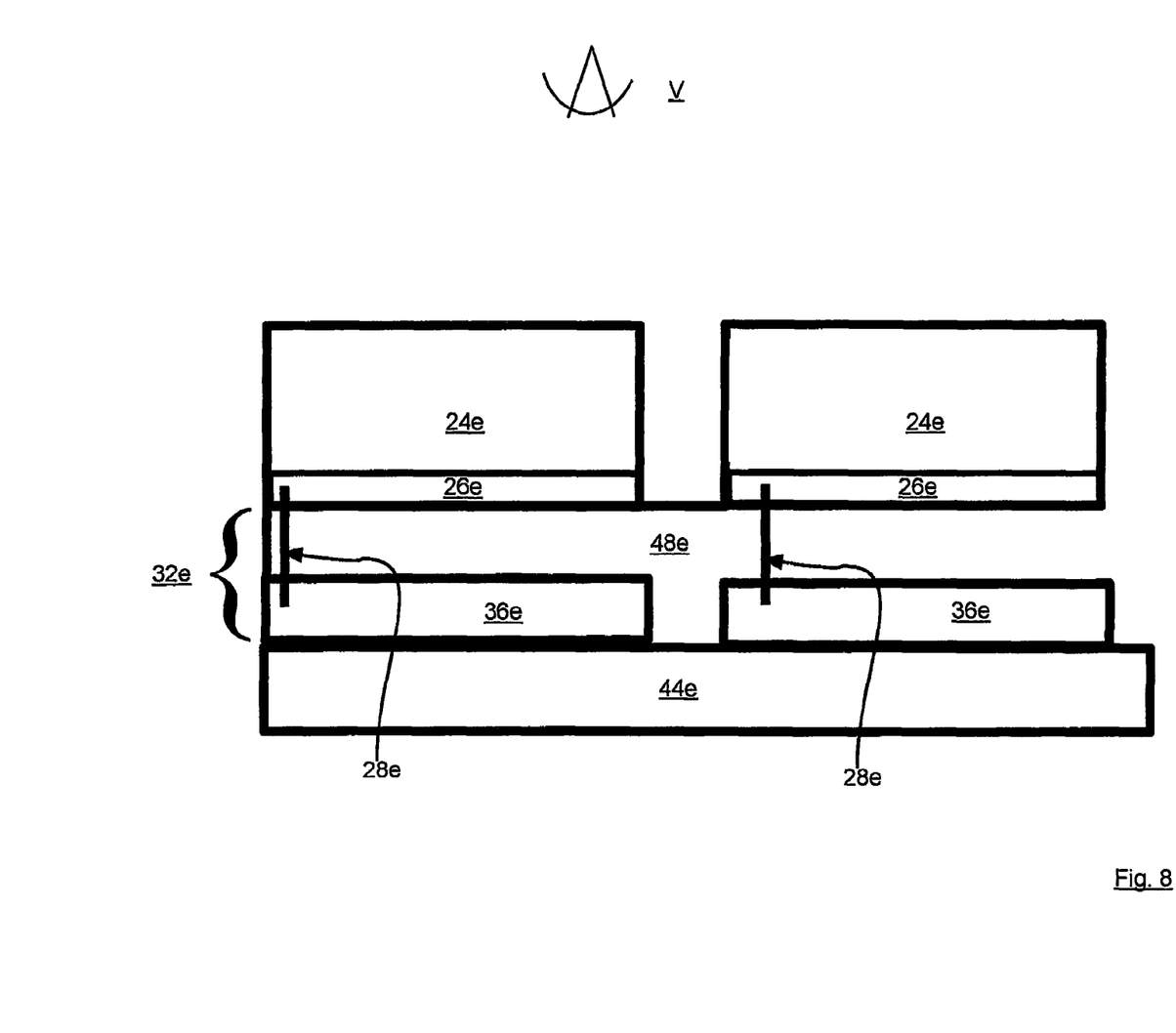
FIG. 8 is a schematic representation of a cross-section of two top-emitting pixels in accordance with another embodiment of the invention; and, FIG. 9 is a schematic representation of a cross-section of a top-emitting pixel in accordance with another embodiment of the invention.

As another example, FIG. 8 shows a top emitting display configuration with two pixels 24e and corresponding electronic components 32e disposed therebelow, all of which are disposed above a glass substrate 44e. The top emitting OLED pixel 28e includes an optical interference member 26e. Electronic components 32e include switching electronics 36e and a contiguous insulating optical interference member 48e. An interconnect 28e joins switching electronics 36e with the anode of pixel 28e. Optical interference member 48e serves to reduce ambient light incident on the display in the areas that are not reduced via the optical interference member 26e of each pixel 24e. The method of FIG. 3 can thus be modified to choose appropriate optical interference members 26e and 48e and thereby attain a substantially uniform reduction of ambient light across the entire display.

It should now be apparent that other configurations of top emitting display configurations, other than those in FIG. 8, can also be formed. For example, the double sided optical interference members 40c1, 40c2 of FIG. 5 can be incorporated into the display configuration of FIG. 8, so that the rearward reflections of each pixel can be reduced and thereby reduce the effects of pixel blooming.

Figure 9:
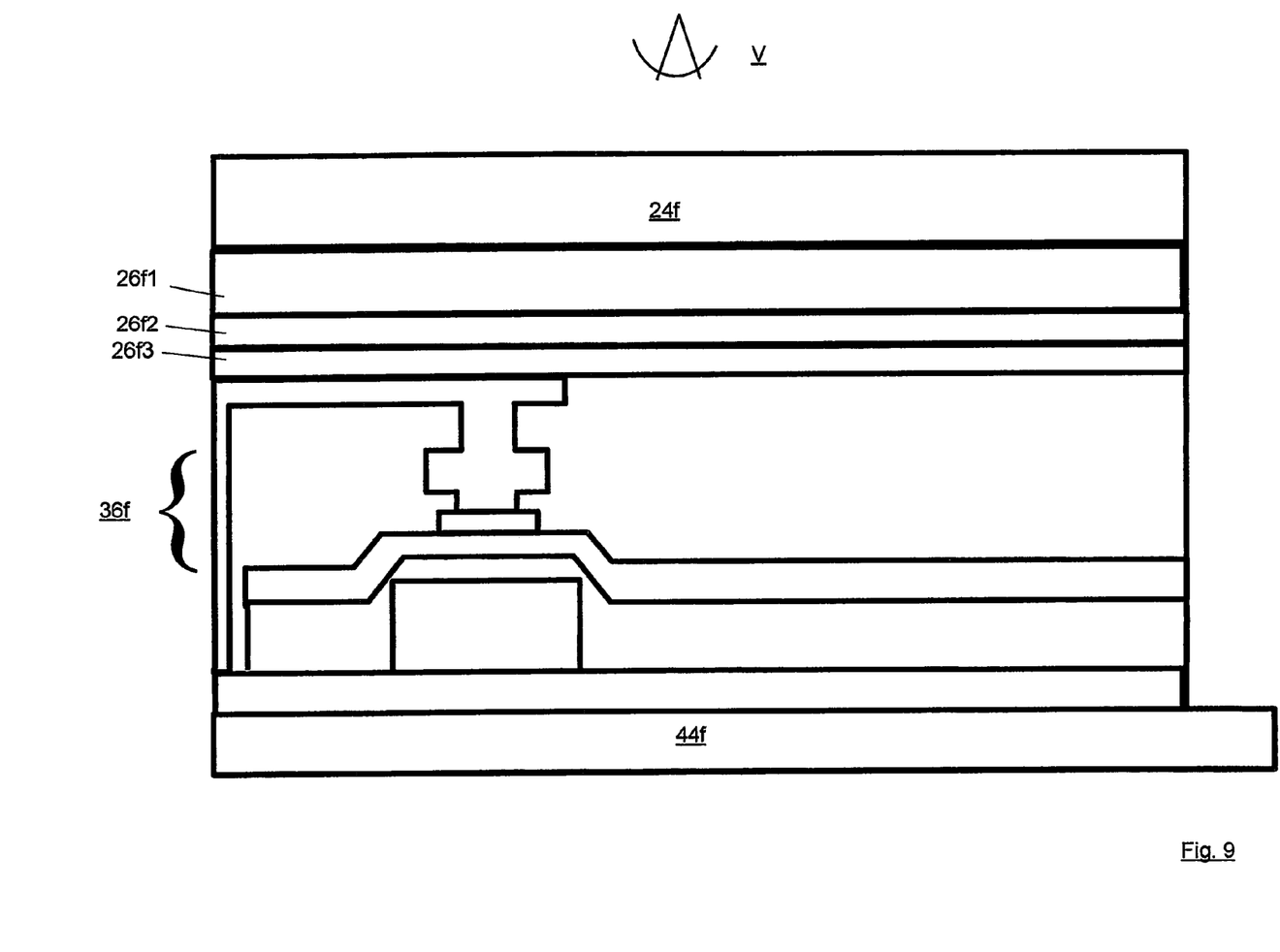

FIG. 9 shows a further example of a top-emitting pixel configuration, wherein a three layered optical interference member 26f lies between switching electronics 36f and OLED pixel 24f, and accordingly, optical interference member 26f masks the complete set of underlying switching electronics 32f. Optical interference member 26f forms part of, or is adjacent to, the anode of the OLED pixel 24f, and therefore conducts current from switching electronics 32f to OLED pixel 24f. In this embodiment, the bus lines interconnecting the switching electronics 32f are not shown, and are also coated with an optical interference member. Accordingly, the method of FIG. 3 can be modified so that the optical interference member coating the bus lines can be matched for reflectance uniformity with optical interference member 26f.

While only specific combinations of the various features and components of the present invention have been discussed herein, it will be apparent to those of skill in the art that desired subsets of the disclosed features and components and/or alternative combinations of these features and components can be utilized, as desired. For example, other display technologies can be used instead of OLED light-emitting pixels—such as inorganic or TFEL light emitting pixels. As another example, each pixel could be a shutter means that passes light emitted from a back light when the pixel is activated.

Furthermore, for each OLED pixel 24, the optical interference member 26 embedded therein can be made of materials that directly work function matches with the emitting organic material of the optical interference member 26, or, a work function matching layer of LiO, LiF or the like can be inserted between the optical interference member 26 and the emitting layer of the pixel 24 in order to provide work function matching.

It is to be further understood that the examples of FIGS. 2, 4, 5, 6, 8 and 9, and/or their combinations can be fabricated in a plurality of manners. In particular, once the overall display is designed, it is contemplated that in the configuration of FIG. 4 (for example), optical interference layer 40b can be deposited onto substrate 44b, for later mating with a configuration that includes the remaining components shown in FIG. 4. In this manner, a large batch of substrates 44b that include optical interference layer 40b can be manufactured at one facility to be later mated with the remaining components at another manufacturing facility. Such variations are within the scope of the invention.

Furthermore, while the embodiments herein discuss ambient light reducing layers based on optical interference, it is contemplated that other types of ambient light reducing layers that can be integrally incorporated into the various layers of a display can also be used in the method of FIG. 3, in lieu of, or in addition to optical interference layers. As is known to those of skill in the art, such other layers can be simply based on carbon "dark layers" that absorb incident ambient light. Other types of "dark layers" will now occur to those of skill in the art. Thus, the method of FIG. 3 can be thus be implemented on a computing device that includes a database of all known such dark layers, (with new layer designs and design techniques added to the database as they are developed) and the appropriate dark layer can be chosen for a particular electronic component in a given display in order to achieve substantial uniformity across the viewing plane of the display.

We claim:
1. A display device comprising:
a plurality of emitting pixels;
at least one switching electronic corresponding to each said pixel for selectively activating or deactivating each said pixel;
at least one additional component for interconnecting said pixels and said switching electronics; and
at least two ambient light reducing members each integrally embedded into at least one of a) said pixels, b) said switching electronics and c) said at least one additional component with one of said at least two ambient light reducing members forming part of circuitry of said switching electronics, said ambient light reducing members being disposed in a plane that is visible to a viewer and selected from materials and thicknesses such that reduced ambient light reflections in said plane are substantially uniform.

2. The display device according to claim 1 wherein said emitting pixels are bottom emitting.

3. The display device according to claim 1 wherein said emitting pixels are top emitting.

4. The display device according to claim 1 wherein said at least one additional component is a set of bus lines for delivering electrical current to said pixels and said switching electronics.

5. The display device according to claim 1 wherein said emitting pixels are comprised of an OLED stack and wherein at least one of said ambient light reducing members is integrated with said OLED stack.

6. The display device according to claim 1 wherein each said switching electronic includes at least one transistor and said one ambient light reducing member is a storage capacitor for said at least one transistor.

7. The display device according to claim 1 wherein each said ambient light reducing member is an optical interference member.

8. The display device according to claim 7 wherein each said optical interference member includes a semi-absorbing layer for reflecting a portion of incident ambient light, a substantially transparent layer for phase shifting another portion of ambient light and a reflective layer for reflecting said phase shifted ambient light such that said two reflected portions of light are out-of-phase and thereby destructively interfere.

9. A display device comprising:
a plurality of emitting pixels;
at least one switching electronic corresponding to each pixel for selectively activating or deactivating said pixel;
at least one additional component for interconnecting said pixels and said switching electronics; and,
an ambient light reducing member integrally embedded into said switching electronics to form part of electronic circuitry of said switching electronics, said ambient light reducing member being disposed in a plane that is visible to a viewer and selected from materials and thicknesses to reduce ambient light reflections.

10. The display device according to claim 9 wherein each said switching electronic comprises at least one transistor and said ambient light reducing member is a storage capacitor for said at least one transistor.

11. The display device according to claim 9 wherein said ambient light reducing member is an optical interference member.

12. The display device according to claim 9 wherein said optical interference member includes a semi-absorbing layer for reflecting a portion of incident ambient light, a substantially transparent layer for phase shifting another portion of ambient light and a reflective layer for reflecting said phase shifted ambient light such that said two reflected portions of light are out-of-phase and thereby destructively interfere.

13. The display device according to claim 9 wherein said emitting pixels are bottom emitting.

14. The display device according to claim 9 wherein said emitting pixels are top emitting.

15. The display device according to claim 9 wherein said at least one additional component is a set of bus lines for delivering electrical current to said pixels and said switching electronics.

* * * * *